US012392052B2

United States Patent
Moriyama et al.

(10) Patent No.: US 12,392,052 B2
(45) Date of Patent: Aug. 19, 2025

(54) FILM DEPOSITION METHOD

(71) Applicant: NuFlare Technology, Inc., Kanagawa (JP)

(72) Inventors: Yoshikazu Moriyama, Shizuoka (JP); Yoshiaki Daigo, Tokyo (JP); Toru Watanabe, Kanagawa (JP); Shigeaki Ishii, Kanagawa (JP)

(73) Assignee: NuFlare Technology, Inc., Kanagawa (JP)

(*) Notice: Subject to any disclaimer, the term of this patent is extended or adjusted under 35 U.S.C. 154(b) by 251 days.

(21) Appl. No.: 18/124,685

(22) Filed: Mar. 22, 2023

(65) Prior Publication Data

US 2023/0304187 A1 Sep. 28, 2023

(30) Foreign Application Priority Data

Mar. 24, 2022 (JP) ................. 2022-049111

(51) Int. Cl.
*C30B 25/16* (2006.01)
*C23C 16/32* (2006.01)
*C23C 16/458* (2006.01)
*C23C 16/46* (2006.01)
*C30B 25/12* (2006.01)
*C30B 29/36* (2006.01)

(52) U.S. Cl.
CPC ............ *C30B 25/16* (2013.01); *C23C 16/325* (2013.01); *C23C 16/4584* (2013.01); *C23C 16/46* (2013.01); *C30B 25/12* (2013.01); *C30B 29/36* (2013.01)

(58) Field of Classification Search
CPC .............. C23C 16/325; C23C 16/4401; C23C 16/45591; C23C 16/4584; C23C 16/4585; C23C 16/46; C23C 16/52; C30B 25/12; C30B 25/16; C30B 29/36
See application file for complete search history.

(56) References Cited

U.S. PATENT DOCUMENTS 9,916,996 B2 3/2018 Yamada et al.
10,490,437 B2 11/2019 Hieda et al.
(Continued)

FOREIGN PATENT DOCUMENTS

JP 2004319623 A 11/2004
JP 2006344758 A 12/2006
(Continued)

OTHER PUBLICATIONS

English computer translation of JP-6076954-B2 (Year: 2025).*
(Continued)

*Primary Examiner* — Matthew J Song
(74) *Attorney, Agent, or Firm* — RANKIN, HILL & CLARK LLP

(57) ABSTRACT

A film deposition method according to an embodiment includes rotating a wafer mounted on a susceptor in a reaction chamber. Next, a temperature of the wafer is controlled such that, when changing a rotational speed of the wafer before and after a film deposition step of introducing a process gas into the reaction chamber and epitaxially growing a SiC film on the wafer, a force of friction generated on a contact surface between the wafer and the susceptor becomes larger than a force of inertia generated in a direction of rotation of the wafer.

9 Claims, 7 Drawing Sheets

(56) References Cited

U.S. PATENT DOCUMENTS

| | | | |
|---|---|---|---|
| 2006/0180086 A1 | 8/2006 | Kanaya et al. | |
| 2007/0173185 A1* | 7/2007 | Natsuhara | H01L 21/68735 |
| | | | 451/285 |
| 2018/0135175 A1 | 5/2018 | Suzuki et al. | |
| 2020/0185220 A1* | 6/2020 | Daigo | H01L 21/02661 |
| 2021/0398794 A1 | 12/2021 | Harada et al. | |

FOREIGN PATENT DOCUMENTS

| | | | | |
|---|---|---|---|---|
| JP | 4019998 B2 | | 12/2007 | |
| JP | 2010027881 A | | 2/2010 | |
| JP | 2010034185 A | * | 2/2010 | H01L 21/683 |
| JP | 2012069677 A | | 4/2012 | |
| JP | 2014103405 A | | 6/2014 | |
| JP | 2015216269 A | | 12/2015 | |
| JP | 2016201528 A | | 12/2016 | |
| JP | 6076954 B2 | * | 2/2017 | H01L 21/683 |
| JP | 2018107289 A | | 7/2018 | |
| JP | 2019-46855 A | | 3/2019 | |
| KR | 20180053628 A | | 5/2018 | |

OTHER PUBLICATIONS

English computer translation of JP-2010034185-A (Year: 2025).*
Extended European Search Report (EESR) dated Sep. 13, 2023 for European Patent Application No. 23163141.7.
Korean Office Action (KROA) dated Jun. 21, 2024 and issued for Korean patent application No. 10-2023-0034325 and its English machine translation.
Japanese Office Action (JPOA) issued on Sep. 27, 2024 to the Japanese Patent Application No. 2022-049111 and its English machine translation.

* cited by examiner

FILM DEPOSITION METHOD

CROSS-REFERENCE TO RELATED APPLICATIONS

This application is based upon and claims the benefit of priority from Japanese Patent Application No. 2022-049111, filed on Mar. 24, 2022; the entire contents of which are incorporated herein by reference.

FIELD

The present invention relates to a film deposition method.

BACKGROUND

When a SiC (silicon carbide) film is deposited by epitaxial growth on a SiC wafer, the SiC wafer is mounted on a susceptor. While the wafer and the susceptor rotate during a film deposition step in which the SiC film is epitaxially grown, a rotational speed of the wafer may be increased or reduced during the film deposition step and before and/or after the film deposition step. Such a change in the rotational speed may cause the wafer to rotate and move on the susceptor and cause a displacement of the wafer.

When a displacement of the wafer occurs, a deposit made of SiC may be formed not only on the SiC wafer but also on a part of a wafer mount of the susceptor during the film deposition step. When a deposit is formed on a part of the wafer mount of the susceptor, a next SiC wafer ends up being installed on the deposit formed on the wafer mount of the susceptor. When a temperature of the SiC wafer is raised to a temperature necessary for epitaxial growth in a state where the SiC wafer is installed on the wafer mount on which a deposit has been partially formed, the deposit may be transferred onto a rear surface of the SiC wafer. A region where such a deposit has been transferred assumes a concavo-convex shape with a large height difference and may cause manufacturing defects to occur in steps subsequent to the film deposition step.

DETAILED DESCRIPTION

Embodiments will now be explained with reference to the accompanying drawings. The present invention is not limited to the embodiments.

A film deposition method according to an embodiment of the present invention includes:

rotating a wafer mounted on a susceptor in a reaction chamber; and controlling a temperature of the wafer such that, when changing a rotational speed of the wafer before and after a film deposition step of introducing a process gas into the reaction chamber and epitaxially growing a SiC film on the wafer, a force of friction generated on a contact surface between the wafer and the susceptor becomes larger than a force of inertia generated in a direction of rotation of the wafer.

First Embodiment

Figure 1:
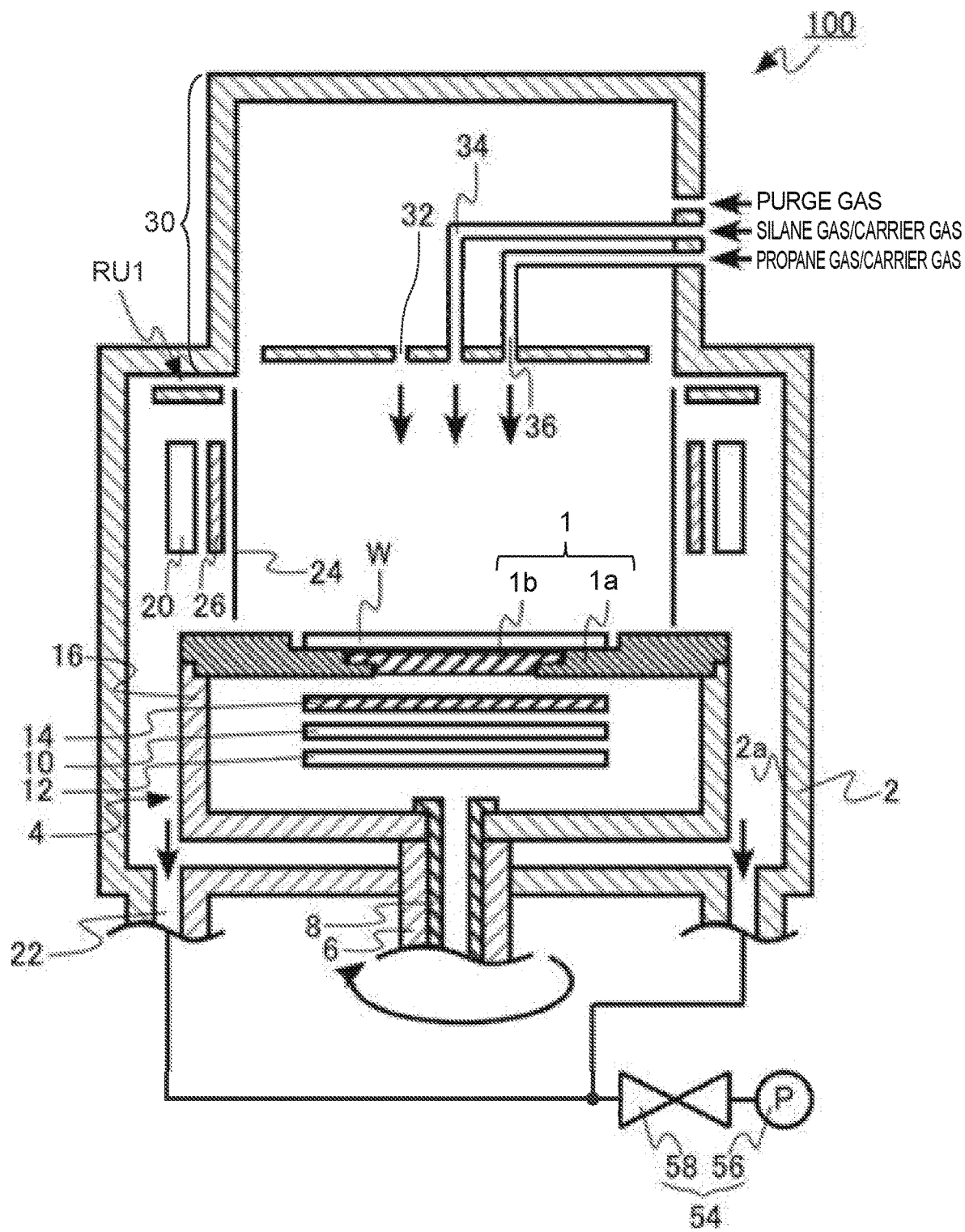
FIG. 1 is a schematic sectional view of a film deposition apparatus according to an embodiment of the present invention.

FIG. 1 is a schematic sectional view of a film deposition apparatus 100 according to an embodiment of the present invention. The film deposition apparatus 100 according to the present embodiment is an epitaxial growth apparatus which uses CVD (Chemical Vapor Deposition). Hereinafter, a case where a SiC film is epitaxially grown on a SiC wafer will be mainly described as an example.

The film deposition apparatus 100 includes a susceptor 1 on which a wafer W is mounted. The susceptor 1 can also be referred to as a susceptor unit and is provided in a reaction chamber 2 which is a film deposition chamber where a SiC epitaxial film is deposited on the wafer W.

Due to a reaction of a process gas supplied to the wafer W mounted on the susceptor 1, a SiC film is epitaxially grown on the wafer W. In this case, examples of the process gas include an Si-based gas (for example, silane ($SiH_4$) gas) as a SiC source gas, a C-based gas (for example, propane ($C_3H_8$) gas), Cl-based gas (for example, hydrogen chloride (HCl) gas) for promoting growth of SiC, argon (Ar) gas as a purge gas, and hydrogen ($H_2$) gas as a carrier gas. Alternatively, a gas containing Si atoms and Cl atoms such as dichlorosilane ($SiH_2Cl_2$) gas or trichlorosilane ($SiHCl_3$) gas can be used as the Si-based gas.

The susceptor 1 is provided above a rotator 4. The susceptor 1 includes a first susceptor 1a which has an annular shape with an opening and a second susceptor 1b which is provided inside the first susceptor 1a so as to block the opening. A depression for housing the wafer W is provided on an inner circumferential side of the first susceptor 1a. In addition, a mount which supports an outer circumference of the wafer W is provided in the depression. Carbon, SiC, or TaC is preferably used as a material of the susceptor 1. Alternatively, a material created by coating a surface of carbon with TaC may be used. Furthermore, a structure of the depression in the first susceptor 1a may be created by counterboring an inner circumferential side of an annular flat-plate material with a bore large enough to house the wafer W, arranging an annular member with an inner diameter large enough to house the wafer W on an outer circumferential side of an annular flat-plate material, or using a combination of both methods.

The rotator 4 is made up of a rotary shaft 6 and a holder 16 connected to an upper part of the rotary shaft 6. The holder 16 supports the susceptor 1 by an upper part thereof. The holder 16 rotates as the rotary shaft 6 is rotated by a motor (not illustrated). The susceptor 1 rotates via the rotation of the holder 16. In this manner, the wafer W mounted on the susceptor 1 can be rotated with approximately the center of the wafer W as a center of rotation.

The holder 16 is structured so that an upper part is open. A first heater 14 is provided inside the rotator 4. For example, a resistive heater made of a carbon (C) material is used as the first heater 14. Power is supplied to the first heater 14 by an electrode (not illustrated) which passes inside a quartz shaft 8 with an approximately cylindrical shape provided inside the rotary shaft 6, and the first heater 14 heats the wafer W from a rear surface thereof via the susceptor 1.

In addition, a reflector 10 is provided below the first heater 14 inside the rotator 4 to ensure that heating by the first heater 14 is performed efficiently. A material with high heat resistance such as carbon or SiC is used as the reflector 10. Furthermore, a heat insulator 12 is provided below the reflector 10. Providing the reflector 10 and the heat insulator 12 reduces transfer of heat from the first heater 14 to the shaft 8, an installation position of the shaft 8, and the like and enables heater power during heating to be suppressed.

An exhaust 22 for discharging an excess process gas or a gas containing reaction by-products is provided in a lower part of the reaction chamber 2. The exhaust 22 is connected to an exhaust mechanism 54 which is made up of a regulating valve 58 and a vacuum pump 56. The exhaust mechanism 54 discharges, to the outside, gas having been discharged from the reaction chamber 2, and regulates the inside of the reaction chamber 2 to predetermined pressure.

In addition, a cylindrical hot wall-type liner (wall surface) 24 for partitioning a film deposition region where film deposition processing is performed and a side wall (inner wall) 2*a* of the reaction chamber 2 from each other and preventing deposits from being generated on the side wall 2*a* is provided inside the reaction chamber 2. A material with high heat resistance such as carbon, carbon coated with SiC, or SiC is used as the hot wall-type liner 24. Desirably, a cylindrical member (not illustrated) for partitioning the rotator 4 and the side wall (inner wall) 2*a* from each other is also provided between the rotator 4 and the side wall (inner wall) 2*a* in order to prevent film from adhering to the side wall (inner wall) 2*a* and to reduce heat input.

A second heater 26 which heats the wafer W from above is provided between the hot wall-type liner 24 and the side wall 2*a*. The wafer W is mounted below a lower end of the second heater 26. The hot wall-type liner 24 is heated by the second heater 26. The second heater 26 is, for example, a resistive heater. In addition, a heat insulator 20 is provided between the second heater 26 and the side wall 2*a* to reduce transfer of heat from the second heater 26 to the side wall 2*a*. Providing the heat insulator 20 enables heater power during heating to be suppressed. Instead of being a single element, the second heater 26 may be divided into independently controllable elements.

The hot wall-type liner 24 may be inductively heated by a high-frequency coil provided outside of the hot wall-type liner 24.

A reflector unit RU1 for reflecting radiation from the first heater 14 and the second heater 26 is provided in an upper part of the reaction chamber 2 in order to increase heat efficiency.

The reflector unit RU1 is made of a thin plate using carbon, SiC, or carbon coated with SiC. The reflector unit RU1 may be made of a single thin plate or constructed by laminating a plurality of thin plates.

A gas supplier 30 is provided in an upper part of the reaction chamber 2. The gas supplier 30 supplies a process gas such as a purge gas or a SiC source gas to the film deposition region via gas flow channels (gas pipes) 32, 34, and 36. For example, an argon gas as a purge gas or hydrogen gas is supplied on top of the wafer W via the gas flow channel 32. In addition, silane gas or propane gas as a SiC source gas is supplied together with a carrier gas on top of the wafer W via the gas flow channels 34 and 36. While FIG. 1 shows one gas flow channel being provided with respect to each gas, a plurality of gas flow channels may be provided instead. Furthermore, the gas supplier 30 may have a shower head-type structure.

A radiation thermometer (not illustrated) is provided in an upper part of the reaction chamber 2 and a temperature of the wafer W can be measured. In this case, a quartz glass window (not illustrated) is provided in a part of the reaction chamber 2 and the temperature of the wafer W is measured by the radiation thermometer via the quartz glass window.

Hereinafter, a film deposition method using the film deposition apparatus 100 configured as described above will be explained.

Figure 2:
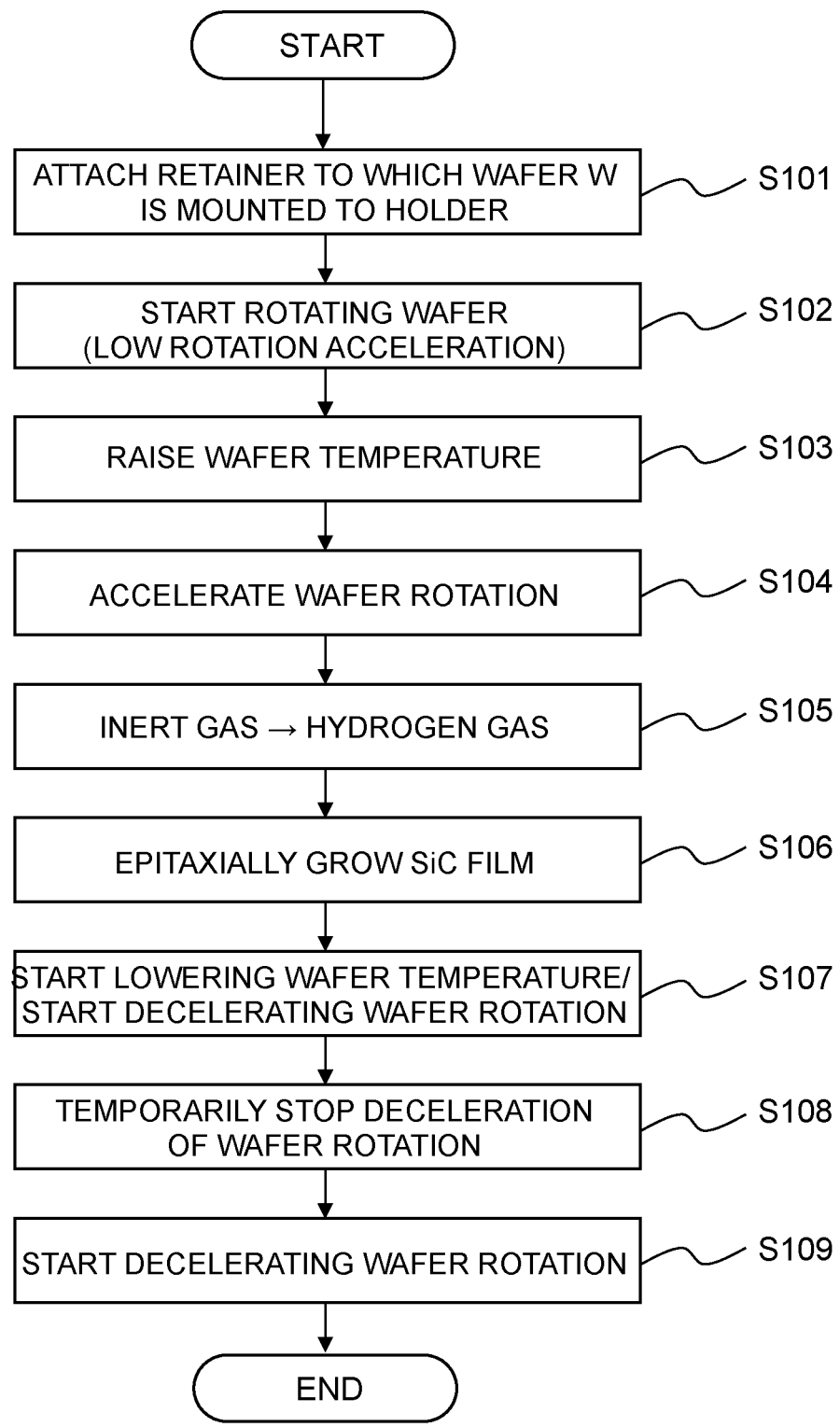
FIG. 2 is a flow chart showing a procedure of a film deposition method according to an embodiment.
Figure 3:
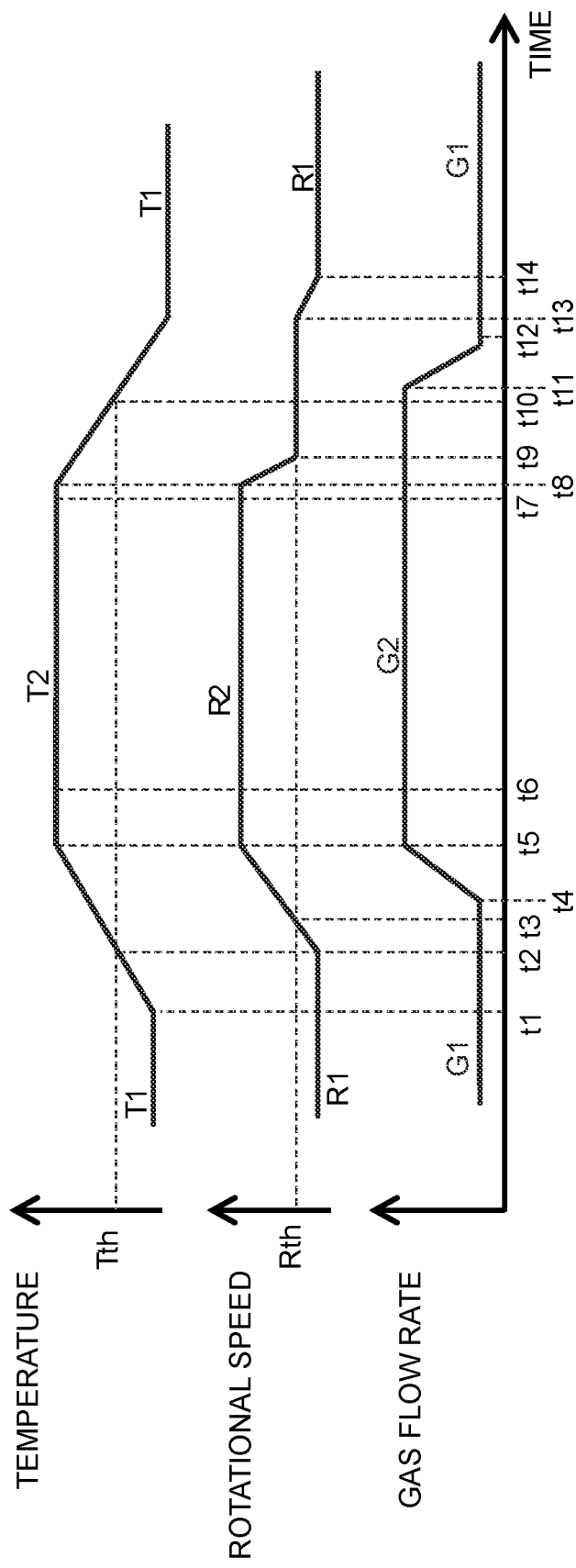
FIG. 3 is a diagram showing a time variation of a temperature of a wafer, a rotational speed of the wafer, and a gas flow rate introduced into a reaction chamber.

FIG. 2 is a flow chart showing a procedure of a film deposition method according to an embodiment. In addition, FIG. 3 is a diagram showing a time variation of the temperature of the wafer W, a rotational speed of the wafer W, and a gas flow rate introduced into the reaction chamber 2.

In the flow chart shown in FIG. 2, first, the susceptor 1 on which the wafer W is mounted is attached to the holder 16 (step S101). At a time point of step S101, the temperature of the wafer W is kept at a first temperature T1 by the first heater 14 and the second heater 26. The first temperature T1 is a temperature when the wafer W is carried in/out to/from the reaction chamber 2 and is, for example, around 900° C. to 1000° C. Although also depending on the temperature of the wafer W when the susceptor 1 on which the wafer W is mounted is carried into the reaction chamber 2, the temperature of the wafer W usually differs from the first temperature T1 immediately after the susceptor 1 on which the wafer W is mounted is attached to the holder 16 but converges to the first temperature T1 once a predetermined amount of time elapses. In FIG. 3, a transient temperature variation immediately after the mounted susceptor 1 is attached to the holder 16 is not taken into consideration.

In addition, in the present embodiment, an inert gas has already been introduced into the reaction chamber 2 by the time point of step S101. In this case, examples of the inert gas include argon (Ar) gas and helium (He) gas. Note that, instead of using an inert gas as the gas to be introduced into the reaction chamber 2 at the time point of step S101, hydrogen (H$_2$) gas can be used. A gas flow rate of the inert gas or hydrogen gas in step S101 is set to a first gas flow rate G1 which is lower than a flow rate of gas used for epitaxial growth. This is done in order to reduce gas consumption and reduce cost. However, when cost need not be taken into consideration, the first gas flow rate G1 may be set equal to a second gas flow rate G2 which is the flow rate of gas used for epitaxial growth.

Next, the holder 16 starts to rotate (step S102). At this point, the rotational speed of the holder 16 is set so that the rotational speed of the wafer W equals a first rotational speed R1. The first rotational speed R1 is a rotational speed in a state before and after depositing a SiC film on the wafer W and is set to, for example, around 50 rpm (revolution per minute).

Next, as shown in FIG. 3, at a time t1 upon elapse of a predetermined amount of time after the rotational speed of the wafer W had reached the first rotational speed R1, the temperature of the wafer W is raised by increasing supplied power to the first heater 14 while keeping supplied power to the second heater 26 constant (step S103).

Next, at a time t2 where the temperature of the wafer W reaches a threshold temperature Tth set in advance, the acceleration of the rotation of the wafer W is started by increasing the rotational speed of the holder 16 (step S104).

Next, at a time t3 where the rotational speed of the wafer W reaches a threshold rotational speed Rth set in advance, the process gas introduced into the reaction chamber 2 is switched from an inert gas to hydrogen gas (step S105). Note that, if the inside of the reaction chamber 2 need not be replaced with an inert gas when carrying the wafer W into the reaction chamber 2 or, in other words, when the wafer W is carried into the reaction chamber 2 in a state where the inside of the reaction chamber 2 is filled with hydrogen gas, there is no need to switch gases from an inert gas to hydrogen gas. In addition, desirably, the gas flow rate of the inert gas or hydrogen gas does not change significantly from the first gas flow rate G1 until the time t3.

Furthermore, at the time t3 where the rotational speed of the wafer W reaches the threshold rotational speed Rth set in advance, the temperature of the wafer W is further raised by increasing supplied power to the second heater 26 in addition to the first heater 14.

Next, at a time t4, an increase of the flow rate of hydrogen gas is started to cause the flow rate to reach the second gas flow rate G2 set in advance. In addition, at a time t5, the temperature of the wafer W is caused to reach a second temperature T2 set in advance. While FIG. 3 shows the time where the temperature of the wafer W reaches the second temperature T2, the time where the rotational speed reaches a second rotational speed R2, and the time where the gas flow rate reaches the second gas flow rate G2 all coinciding with each other at t5 for the sake of convenience, the times are not limited to t5.

Once the rotational speed of the wafer W reaches the second rotational speed R2, the temperature of the wafer W reaches the second temperature T2, and the gas flow rate reaches the second gas flow rate G2, at a time t6, a Si-based gas, a C-based gas, a Cl-based gas for promoting growth of SiC, and the like are introduced into the reaction chamber 2 together with hydrogen gas to epitaxially grow a SiC film on the wafer W (step S106). The second temperature T2 is a film deposition temperature of the SiC film and is, for example, around 1625° C. In addition, the second rotational speed R2 is, for example, around 600 rpm. Furthermore, the second gas flow rate G2 is around 100 to 150 slm. Note that, in a graph representing a gas flow rate in FIG. 3, an increase in the gas flow rate due to the start of supply of the Si-based gas, the C-based gas, the Cl-based gas, and the like is not taken into consideration. Alternatively, before supplying the Si-based gas, the C-based gas, the Cl-based gas, and the like and starting epitaxial growth, a period (between the time t5 to the time t6) of a predetermined amount of time in which the Si-based gas, the C-based gas, the Cl-based gas, and the like are not supplied may be provided to subject a surface of the wafer W to etching by hydrogen gas.

Next, at a time t7 upon elapse of a film deposition time from the time t6, the introduction of process gases necessary for epitaxially growing the SiC film such as the Si-based gas, the C-based gas, and the Cl-based gas for promoting growth of SiC is stopped. Accordingly, the epitaxial growth is stopped. Note that hydrogen gas is continuously introduced into the reaction chamber 2.

Next, at a time t8, the temperature of the wafer W is lowered by reducing supplied power of the first heater 14 and the second heater 26 (step S107). In addition, at the time t8, the deceleration of the rotation of the wafer W is started by reducing the rotational speed of the holder 16. While the graphs in FIG. 3 show the epitaxial growth being stopped at the time t7 and, subsequently, at the time t8, lowering of the temperature of the wafer W is started and reduction of the rotational speed of the wafer W is also started, a timing where lowering of the temperature of the wafer W is started and a timing where reduction of the rotational speed of the wafer W is started may coincide with a timing where the epitaxial growth is stopped. Furthermore, the timing where lowering of the temperature of the wafer W is started and the timing where reduction of the rotational speed of the wafer W is started need not necessarily coincide with each other.

Next, at a time t9 where the rotational speed of the wafer W reaches the threshold rotational speed Rth, deceleration of the rotational speed of the wafer W is temporarily stopped (step S108). In other words, the rotational speed of the wafer W is maintained at the threshold rotational speed Rth. Note that the rotational speed of the wafer W is maintained at the threshold rotational speed Rth until a time t13 to be described later where further reduction of a rotational speed of the holder 16 is started.

Next, at a time t11, the gas flow rate is reduced, and once the gas flow rate drops to the first gas flow rate G1, at a time t12, the process gas introduced into the reaction chamber 2 is switched from hydrogen gas to an inert gas. Note that, if the inside of the reaction chamber 2 need not be replaced with an inert gas when carrying the wafer W out from the reaction chamber 2 or, in other words, when the wafer W is carried out from the reaction chamber 2 in a state where the inside of the reaction chamber 2 is filled with hydrogen gas, there is no need to switch gases from an inert gas to hydrogen gas. In addition, as described earlier, when cost need not be taken into consideration, the first gas flow rate G1 may be set equal to the second gas flow rate G2 which is the flow rate of gas used for epitaxial growth and, in such a case, the gas flow rate need not be changed.

Next, at a time t13, the rotational speed of the wafer W is further lowered from the threshold rotational speed Rth by further reducing the rotational speed of the holder 16 (step S109). The rotational speed of the wafer W drops to the first rotational speed R1 at a time t14.

Subsequently, the rotation of the wafer W is stopped, the wafer W and the susceptor 1 are carried out from the reaction chamber 2, and a next wafer W and the susceptor 1 are carried into the reaction chamber 2.

Hereinafter, a state of a wafer when a film is deposited by the film deposition method described above will be explained.

Figure 4A:
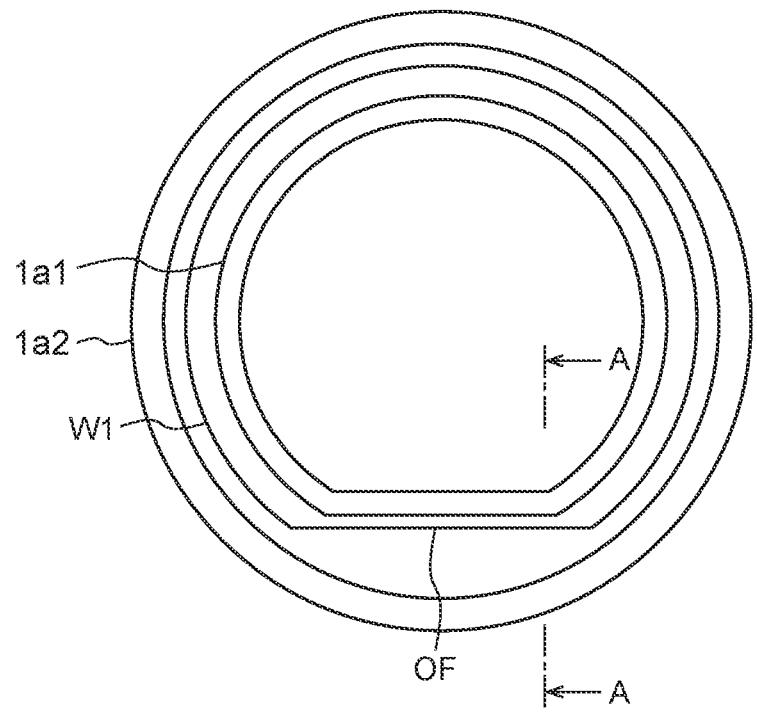
FIG. 4A is a plan view showing a state where a first wafer is mounted on a first susceptor.
Figure 4B:
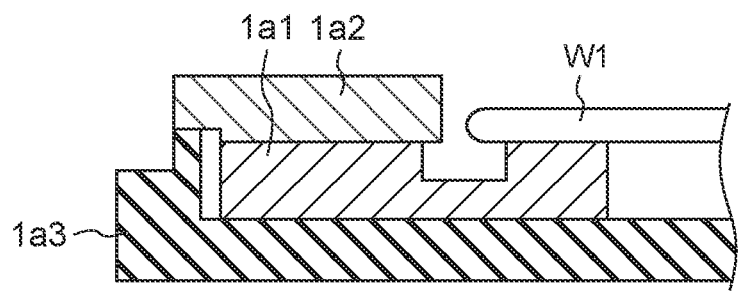
FIG. 4B is a sectional view taken along a cut line A-A shown in FIG. 4A.

FIG. 4A is a plan view showing a state where a first wafer W1 is mounted on the first susceptor 1a. FIG. 4B is a sectional view taken along a cut line A-A shown in FIG. 4A. The wafer W1 is supported by a wafer rear surface mount member 1a1 on a rear surface side thereof. The wafer rear surface mount member 1a1 constitutes a part of the first susceptor 1a by being housed in a depression of the first susceptor 1a. The wafer rear surface mount member 1a1 is an annular member made of, for example, carbon (C).

In addition, a side surface (outer circumferential surface) of the wafer W1 is surrounded by a side surface guide 1a2 arranged on the wafer rear surface mount member 1a1. The side surface guide 1a2 makes up another part of the first susceptor 1a. The side surface guide 1a2 is an annular member made of, for example, SiC. The wafer rear surface mount member 1a1 and the side surface guide 1a2 are supported by a base material 1a3 of the first susceptor 1a. The base material 1a3 is detachably attached to the holder 16.

While the first susceptor 1a is structurally made up of the wafer rear surface mount member 1a1, the side surface guide 1a2, and the base material 1a3 in the present embodiment, the structure of the first susceptor 1a is not limited to this structure. For example, in the structure of the first susceptor 1a, the wafer rear surface mount member 1a1 and the side surface guide 1a2 may be integrated from a same material.

When the water W1 is mounted on the susceptor 1 and rotation of the susceptor 1 is started, a force of inertia in a direction of rotation and a force of friction in the direction of rotation on a contact surface with the wafer rear surface mount member 1a1 are generated on the wafer W1. When a rotational speed of the susceptor 1 is increased, the force of friction with respect to the wafer W1 is generated in a same direction as the direction in the wafer W1 rotates (a positive direction) while the force of inertia with respect to the wafer W1 is generated in an opposite direction to the direction in the wafer W1 rotates (a negative direction). When angular acceleration of rotation is small, since the force of inertia and the force of friction in the direction of rotation are balanced with each other, the wafer W1 is not displaced in the direction of rotation on the wafer rear surface mount member 1a1. However, when the angular acceleration of rotation is large, since the force of inertia exceeds a maximum static frictional force, the wafer W1 is more likely to be displaced in the direction of rotation on the wafer rear surface mount member 1a1. Note that, since horizontal movement of the wafer W1 is suppressed by the side surface guide, the force of inertia and the force of friction in a radial direction of the wafer W are not taken into consideration.

For example, using a SiC wafer with a diameter of 150 mm, a thickness of 350 μm, an orientation flat length of 47.5 mm, and warpage of 60 μm or less and the susceptor 1 in which a mount surface in the wafer rear surface mount member 1a1 has a flatness of 0.2 mm and a surface roughness Rz of 12 μm, when rotating the susceptor 1 under conditions including the threshold temperature Tth described earlier being lower than 1100° C. and angular acceleration when rotating the susceptor 1 being 0.314 rad/sec$^2$ (≈3 rpm/sec), the position of the wafer W1 may be displaced by around several degrees to 45 degrees in the direction of rotation on the wafer rear surface mount member 1a1. Such a displacement in the direction of rotation is likely to occur when the rotational speed changes or, in other words, in FIG. 3, during a period from the time t2 to the time t5, during a period from the time t8 to the time t9, and during a period from the time t13 to the time t14. The thickness of the SiC wafer favorably ranges from 200 to 500 μm. When the thickness is less than 200 μm, the advantageous effect is suppressed due to the force of friction being too small, and when the thickness is more than 500 μm, substrate cost becomes excessive. More preferably, the thickness ranges from 295 to 355 μm. In addition, the flatness of the mount surface preferably ranges from 0.1 to 0.3 mm and more preferably ranges from 0.1 to 0.2 mm, and the surface roughness of the mount surface preferably ranges from 3 to 35 μm and more preferably ranges from 10 to 13 μm. This is because the advantageous effect is suppressed due to the force of friction being too small when the flatness and the surface roughness are lower than a lower limit while characteristics of the film formed on the substrate are adversely affected when the flatness and the surface roughness are excessively high.

Figure 5A:
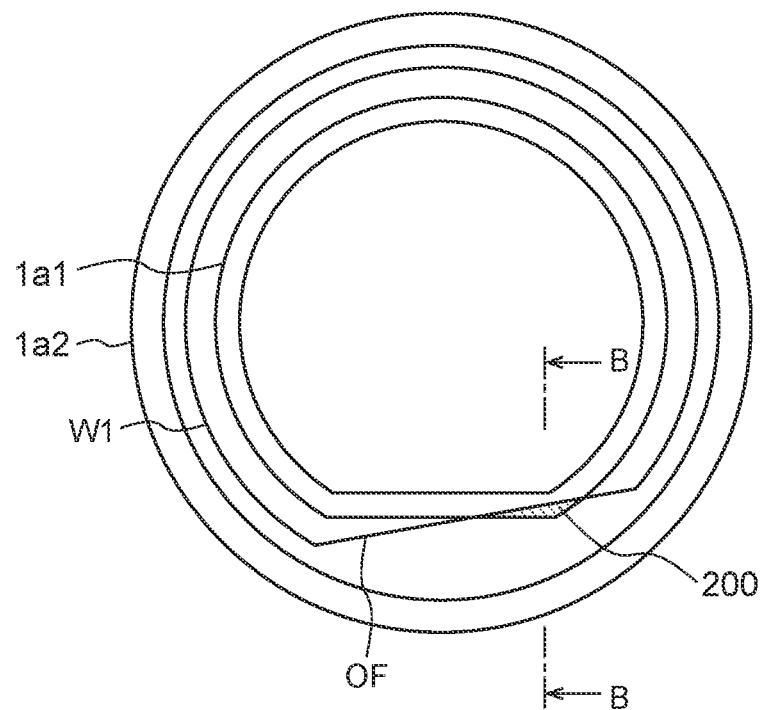
FIG. 5A is a plan view showing an example of a state where a wafer is displaced in a direction of rotation on a wafer rear surface mount member.
Figure 5B:
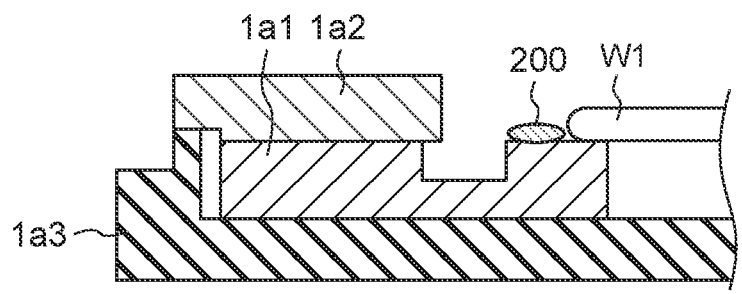
FIG. 5B is a sectional view taken along a cut line B-B shown in FIG. 5A.

FIG. 5A is a plan view showing an example of a state where the wafer W1 is displaced in a direction of rotation on the wafer rear surface mount member 1a1. FIG. 5B is a sectional view taken along a cut line B-B shown in FIG. 5A.

As shown in FIG. 5A, a linear orientation flat OF is formed in a part of the outer circumferential surface of the wafer W1. Therefore, when the position of the wafer W1 is displaced in the direction of rotation on the wafer rear surface mount member 1a1, a part of the wafer rear surface mount member 1a1 becomes exposed. Therefore, when such a displacement occurs during the period from the time t2 to the time t5 shown in FIG. 3, a SiC film is to be epitaxially grown on the wafer W1 in a state where a part of the wafer rear surface mount member 1a1 is exposed during the epitaxial growth period from the time t6 to the time t7. In this case, a deposit 200 made of SiC ends up being formed in the exposed portion of the wafer rear surface mount member 1a1. The deposit 200 remains even after the wafer W1 is carried out from the reaction chamber 2 after the film deposition step.

Figure 6A:
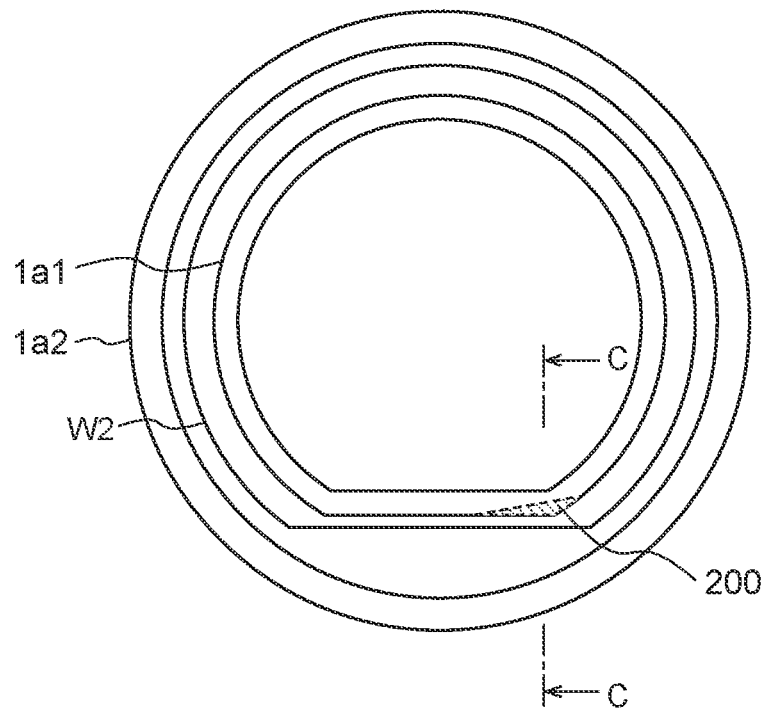
FIG. 6A is a plan view showing a state where a second wafer is mounted on a wafer rear surface mount member.
Figure 6B:
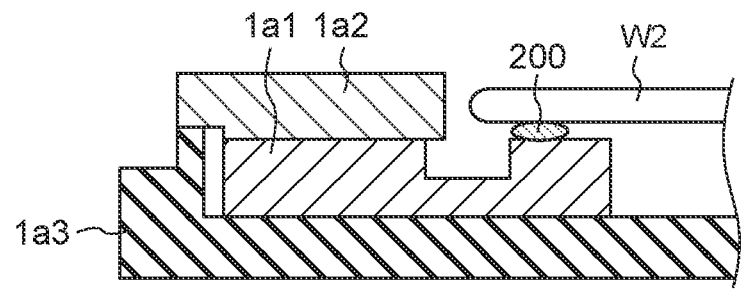
FIG. 6B is a sectional view taken along a cut line C-C shown in FIG. 6A.

FIG. 6A is a plan view showing a state where a second wafer W2 is mounted on the wafer rear surface mount member 1a1. FIG. 6B is a sectional view taken along a cut line C-C shown in FIG. 6A.

When the second wafer W2 is mounted on the wafer rear surface mount member 1a1 in a state where the deposit 200 remains on the wafer rear surface mount member 1a1, the deposit 200 and the wafer W2 come into contact with each other. When temperatures of the susceptor 1 and the wafer W2 are raised in this state, the deposit 200 is transferred onto the rear surface of the wafer W2. As a result, manufacturing defects may occur in steps subsequent to the film deposition step.

The generation of the deposit 200 described above is attributable to a displacement of the wafer W1 in the direction of rotation. In addition, the displacement of the wafer W1 is attributable to the force of inertia in the direction of rotation which occurs on the wafer W1 due to rotating the susceptor 1 exceeding a maximum static frictional force on a contact surface between the wafer rear surface mount member 1a1 and the wafer.

However, the maximum static frictional force increases as the temperature of the wafer W rises. In consideration thereof, in the present embodiment, the temperature of the wafer W is controlled during an acceleration period of the wafer W from the time t2 to the time t5 so that a relationship in which the maximum static frictional force is higher than the force of inertia can be readily maintained. Specifically, supply power to the first heater 14 and the second heater 26 is adjusted so that the threshold temperature Tth exceeds 1100° C.

When the threshold temperature Tth is higher than 1100° C. and equal to or lower than 1300° C., an amount of displacement of the wafer W can be suppressed to around half of an amount of displacement when the threshold temperature Tth is 1100° C.

In addition, when the threshold temperature Tth is higher than 1300° C. and equal to or lower than 1400° C., the amount of displacement of the wafer W can be suppressed to or lower than around ⅓ of the amount of displacement when the threshold temperature Tth is 1100° C.

Furthermore, when the threshold temperature Tth is higher than 1400° C., the amount of displacement of the wafer W can be more readily suppressed to approximately zero. As described above, when the threshold temperature Tth is higher than 1100° C., the amount of displacement of the wafer W can be more readily suppressed to within an allowable range.

The displacement of the wafer W1 in the direction of rotation may occur not only during the rotational speed acceleration period from the time t2 to the time t5 but also during the rotational speed deceleration periods from the time t8 to the time t9 and from the time t13 to the time t14 shown in FIG. 3. In particular, in the period from the time t8 to the time t9, hydrogen gas is introduced into the reaction chamber 2 and a high-temperature region which is close to the film deposition temperature of the SiC film is created. Therefore, when the position of the wafer W1 is displaced in the direction of rotation on the wafer rear surface mount member 1a1, a part of the wafer rear surface mount member 1a1 becomes exposed and a surface of the wafer rear surface mount member 1a1 may become damaged due to etching by hydrogen gas or the like. Therefore, in the present embodiment, deceleration of the rotational speed is temporarily stopped during a period in which the wafer temperature is higher than the threshold temperature Tth. Accordingly, the maximum static frictional force on the contact surface between the wafer rear surface mount member 1a1 and the wafer can be set higher than the force of inertia in the direction of rotation which is generated on the wafer W1 not only during acceleration of the rotation of the wafer W but also during deceleration of the rotation of the wafer W. As a result, displacement of the wafer W can be suppressed and damage to the wafer rear surface mount member 1a1 can be suppressed. Although the rotational speed of the wafer W may be maintained at the second rotational speed R2 from the time t8 to the time t13 and the rotational speed of the wafer W may be decelerated from the time t13, since this extends a period during which the rotational speed is lowered to the first rotational speed R1, throughput tends to decline.

Figure 7:
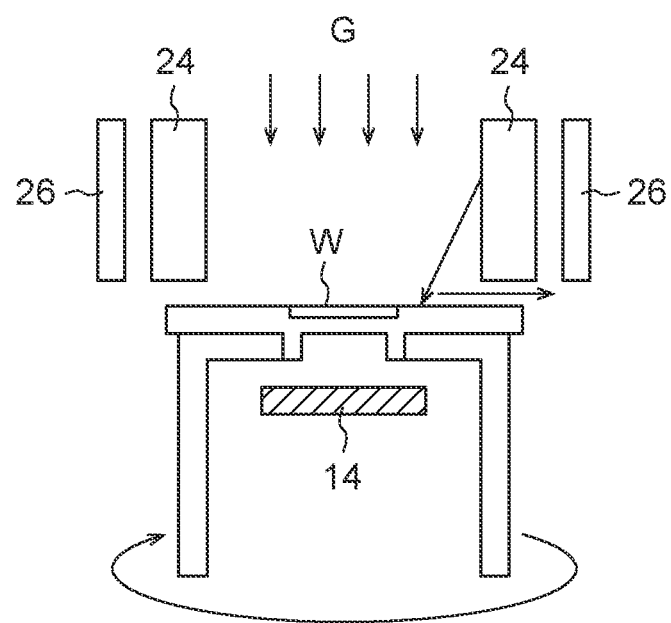
FIG. 7 is a diagram showing an upper portion of a wafer in a film deposition apparatus in a simplified manner.

FIG. 7 is a diagram showing an upper portion of the wafer W in the film deposition apparatus 100 in a simplified manner. As shown in FIG. 7, the hot wall-type liner (wall surface) 24 is provided on an upper side of the wafer W. A process gas G for forming a SiC film on the wafer W is passed through an inner region of the hot wall-type liner 24 and introduced onto the wafer W. Therefore, a deposit made of SiC may be formed on the hot wall-type liner 24. It is presumed that a large distortion has occurred, particularly in a low-temperature region, at an interface between the deposit made of SiC and the hot wall-type liner 24 due to a difference in coefficients of thermal expansion between the deposit made of SiC and the hot wall-type liner 24.

In the low-temperature region, when the hot wall-type liner 24 is subjected to a temperature change due to the second heater 26, the deposit more readily separates from the hot wall-type liner 24. The separated deposit falls onto the wafer W as a particle. Note that switching gases between a noble gas and hydrogen gas and a fluctuation in the gas flow rate also cause a temperature change of the hot wall-type liner 24.

When a particle adheres to the wafer W before film deposition, there is a risk that the particle becomes embedded in the SiC film on the wafer W while the SiC film is being deposited and a film deposition failure such as a defect may occur. In addition, when a particle adheres to the wafer W after film deposition, manufacturing defects may occur in steps subsequent to the film deposition step. In order to prevent such a particle from adhering to the wafer W, the rotational speed of the wafer W is desirably set to or higher than the threshold rotational speed Rth at timings where particles are likely to be generated.

Therefore, in the present embodiment, supplied power to the second heater 26 is desirably kept constant during the period prior to the time t3 and the period after the time t13 or, in other words, during periods where the rotational speed of the wafer W is lower than the threshold rotational speed Rth. In addition, desirably, switching between a noble gas and hydrogen gas and a change in the gas flow rate are not performed. Accordingly, an occurrence of a temperature change of the hot wall-type liner 24 can be suppressed during a period where the rotational speed of the wafer W is lower than the threshold rotational speed Rth. In other words, since the generation of particles can be suppressed in a period where the rotational speed of the wafer W is lower than the threshold rotational speed Rth, film deposition failures can be reduced.

In addition, during the period from the time t3 to the time t13, desirably, the rotational speed of the wafer W is set to or higher than the threshold rotational speed Rth and higher power than during the period prior to the time t3 and the period after the time t13 is supplied to the second heater 26. By heating a wall surface in a state of a high rotational speed as described above, the wafer W can be heated at a high temperature while preventing particles from adhering to the wafer W.

Furthermore, during the period from the time t3 to the time t13, desirably, switching between a noble gas and hydrogen gas and a change in the gas flow rate are performed as necessary while setting the rotational speed of the wafer W to or higher than the threshold rotational speed Rth. By controlling the switching of gases and the flow rate at a high rotational speed in this manner, switching between a noble gas and hydrogen gas and a change in the gas flow rate can be performed while preventing particles from adhering to the wafer W. Note that, if the inside of the reaction chamber 2 need not be replaced with an inert gas when carrying the wafer W out from the reaction chamber 2 or, in other words, when the wafer W is carried out from the reaction chamber 2 in a state where the inside of the reaction chamber 2 is filled with hydrogen gas, there is no need to switch gases from an inert gas to hydrogen gas. In addition, when cost need not be taken into consideration, the first gas flow rate G1 may be set equal to the second gas flow rate which is the flow rate of gas used for epitaxial growth and, in such a case, the gas flow rate need not be changed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A film deposition method, comprising:
   rotating a wafer mounted on a susceptor in a reaction chamber; and
   controlling a temperature of the wafer such that, when changing a rotational speed of the wafer before and after a film deposition step of introducing a process gas into the reaction chamber and epitaxially growing a SiC film on the wafer, a force of friction generated on a contact surface between the wafer and the susceptor becomes larger than a force of inertia generated in a direction of rotation of the wafer, wherein the temperature of the wafer at a starting point of a rotational speed acceleration is a threshold temperature, during a rotational speed deceleration period after stopping the epitaxial growth, the temperature and the rotational speed of the wafer decrease, and when the rotational speed reaches a threshold rotational speed, the rotational speed is maintained at the threshold rotational speed until the temperature of the wafer reaches a first temperature, wherein the point in time when the temperature of the wafer reaches the threshold temperature during the temperature decrease falls within the period when the rotational speed is maintained at the threshold rotational speed, the threshold rotational speed falls between a first rotational speed in a state before and after depositing the SiC film on the wafer and a second rotational speed during epitaxial growth of the SiC film and which is higher than the first rotational speed, wherein the first temperature is a temperature when the wafer is carried in/out to/from the reaction chamber.

2. The film deposition method according to claim 1, wherein a temperature of the wafer when changing the rotational speed of the wafer is higher than 1100° C.

3. The film deposition method according to claim 2, wherein the threshold temperature is higher than 1100° C.

4. The film deposition method according to claim 1, wherein a flatness of the contact surface in the susceptor ranges from 0.1 to 0.3 mm and a surface roughness of the contact surface ranges from 3 to 35 μm.

5. The film deposition method according to claim 1, wherein a wall surface of the reaction chamber is heated when the rotational speed of the wafer is equal to or higher than the threshold rotational speed.

6. The film deposition method according to claim 5, wherein the wall surface of the reaction chamber is heated so as to heat the wafer and the susceptor.

7. The film deposition method according to claim 1, wherein the process gas is switched between an inert gas and hydrogen gas when the rotational speed of the wafer is equal to or higher than the threshold rotational speed.

8. The film deposition method according to claim 7, wherein when the temperature reaches the first temperature during the rotational speed deceleration period, the rotational speed is further reduced below the threshold rotational speed and switching between the inert gas and hydrogen gas is not performed.

9. The film deposition method according to claim 1, wherein during the period when the rotational speed is maintained at the threshold rotational speed, a gas flow rate of the process gas is reduced from a second gas flow rate used for epitaxial growth, and before the rotational speed is reduced below the threshold rotational speed, the gas flow rate is changed from the second gas flow rate to a first gas flow rate which is lower than the second gas flow rate.

* * * * *